United States Patent
Inoue et al.

(10) Patent No.: US 6,452,306 B1
(45) Date of Patent: Sep. 17, 2002

(54) SURFACE ACOUSTIC WAVE DEVICE AND PIEZOELECTRIC SUBSTRATE USED THEREFOR

(75) Inventors: Kenji Inoue; Katsuo Sato; Hiroki Morikoshi; Katsumi Kawasaki, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/952,927

(22) Filed: Sep. 14, 2001

(30) Foreign Application Priority Data

Sep. 20, 2000 (JP) ........................................ 2000-285568

(51) Int. Cl.[7] ............................................. H01L 41/04
(52) U.S. Cl. ................................... 310/313 A; 310/358
(58) Field of Search ............................. 310/313 A, 358, 310/360; 252/629 R

(56) References Cited

U.S. PATENT DOCUMENTS

2002/0015452 A1 * 2/2002 Chai et al. ................... 333/187
2002/0021193 A1 * 2/2002 Chai et al. ................... 375/319
2002/0027397 A1 * 3/2002 Chai et al. .............. 310/313 R

OTHER PUBLICATIONS

Mill et al, "Synthesis, Growth, and Some Propertties of Single Crystals with Ca3Ga2Ge4O14 Structure," Jan. 1999, 1999 Joint Meeting EFTF—IEEE IFCS, pp. 829–834.*
Chai et al, "A New Class of Ordered Langasite Structure Compounds," Apr. 2000, 2000 IEEE/EIA Inter. Freq. Sym. and Exh., pp. 163–168.*
Takeda et al, "Synthesis and Characterization of Sr3TaGa3Si2O14 Single Crystals," Jan. 2000, Materials Research Bulletin, vol. 35, pp. 245–252.*
Mill et al, "Langasite–type Materials: From Discovery to Present State," Apr. 2000, 2000 IEEE/EIA Inter. Freq. Sym. and Exh., pp. 133–144.*

Yasutaka Shimizu—"Propagation Characteristics of SAW Materials and Their Current Application"—Transaction of The Institute of Electronics, Information and Communication Engineers A, vol. J76–A, No. 2, pp. 129–137 (1993) and English abstract thereof.
"4.1.2. Effective Electromechanical Coupling Factor of Surface Wave" in "Chapter I. Basis" in "Surface Acoustic Wave Device and its Application" (edited by Electronic Materials Manufacturers Association, published by The Nikkan Kogyo Shinbun, Ltd 1978). and English abstract thereof.
Bruce H.T. Chai, "Langasite Family Compounds for Bulk and Surface Acoustic Device Applications," Lecture for 29 Ann. Electromechanical Symp., May 18–19, 2000, Chiba, JP.

* cited by examiner

*Primary Examiner*—Nestor Ramirez
*Assistant Examiner*—Peter Medley
(74) *Attorney, Agent, or Firm*—Brown Raysman Millstein Felder & Steiner, LLP

(57) ABSTRACT

A compact and wide band surface acoustic wave device for intermediate-frequency is disclosed. A piezoelectric substrate for use in a surface acoustic wave device having high electromechanical coupling factor and low SAW velocity is also disclosed.

The surface acoustic wave device is constituted of a piezoelectric substrate 1 and inter-digital electrodes 2, 2 formed on the piezoelectric substrate 1. The piezoelectric substrate 1 has a crystal structure of $Ca_3Ga_2Ge_4O_{14}$ and is represented by the chemical formula, $Sr_3NbGa_3Si_2O_{14}$. A cut angle of the piezoelectric substrate 1 cut out of the single crystal and a direction of propagation of surface acoustic waves on the piezoelectric substrate represented in terms of Euler's angles ($\phi$, $\theta$, $\psi$) are found in one of a first area represented by $-5° \leq \phi \leq 15°$, $0° \leq \theta \leq 180°$, and $-50° \leq \psi \leq 50°$ and a second area represented by $15° \leq \phi \leq 30°$, $0° \leq \theta \leq 180°$, and $-40° \leq \psi \leq 40°$.

10 Claims, 9 Drawing Sheets

FIG.2

| SAW Velocity (m/s) | | $\psi$ (°) | | | | | | |
|---|---|---|---|---|---|---|---|---|
| | | 0 | 10 | 20 | 30 | 40 | 50 | 60 |
| $\theta$ (°) | 0 | 3003 | 3027 | 3084 | 3135 | 3084 | 3027 | 3003 |
| | 20 | - | - | 3134 | 3113 | 3081 | 3045 | 3020 |
| | 40 | 2999 | 3024 | 3059 | 3076 | 3085 | 3090 | 3095 |
| | 60 | 2925 | 2943 | 2981 | 3023 | 3064 | 3104 | 3142 |
| | 80 | 2877 | 2891 | 2925 | 2967 | 3012 | 3059 | 3107 |
| | 100 | 2862 | 2873 | 2899 | 2933 | 2966 | 3004 | 3049 |
| | 120 | 2872 | 2881 | 2905 | 2933 | 2958 | 2987 | 3030 |
| | 140 | 2903 | 2913 | 2939 | 2971 | 2999 | 3026 | 3070 |
| | 160 | 2950 | 2964 | 3000 | 3046 | 3076 | 3050 | 3065 |
| | 180 | 3003 | 3027 | 3084 | 3135 | 3084 | 3027 | 3003 |

FIG.3

| ELECTRO-MECHANICAL COUPLING FACTOR (%) | | $\psi$ (°) | | | | | | |
|---|---|---|---|---|---|---|---|---|
| | | 0 | 10 | 20 | 30 | 40 | 50 | 60 |
| $\theta$ (°) | 0 | 0.01 | 0.10 | 0.25 | - | 0.25 | 0.10 | 0.01 |
| | 20 | - | - | 0.44 | 0.40 | 0.36 | 0.21 | 0.06 |
| | 40 | 0.32 | 0.46 | 0.57 | 0.50 | 0.39 | 0.25 | 0.10 |
| | 60 | 0.54 | 0.56 | 0.55 | 0.45 | 0.32 | 0.20 | 0.11 |
| | 80 | 0.60 | 0.59 | 0.51 | 0.39 | 0.25 | 0.14 | 0.07 |
| | 100 | 0.55 | 0.53 | 0.48 | 0.39 | 0.26 | 0.14 | 0.06 |
| | 120 | 0.40 | 0.41 | 0.43 | 0.42 | 0.33 | 0.19 | 0.08 |
| | 140 | 0.24 | 0.27 | 0.37 | 0.45 | 0.42 | 0.23 | 0.10 |
| | 160 | 0.10 | 0.17 | 0.31 | 0.44 | 0.31 | 0.03 | 0.02 |
| | 180 | 0.01 | 0.10 | 0.25 | - | 0.25 | 0.10 | 0.01 |

FIRST AREA (SAW VELOCITY) [m/s]

FIRST AREA (ELECTROMECHANICAL COUPLING FACTOR) [%]

FIG.5

| SAW Velocity (m/s) | | $\psi$ (°) | | | | | | |
|---|---|---|---|---|---|---|---|---|
| | | -60 | -40 | -20 | 0 | 20 | 40 | 60 |
| $\theta$ (°) | 0 | 3027 | 2888 | 3027 | 3027 | 3133 | 3027 | 3027 |
| | 20 | 3065 | 3129 | - | - | 3096 | 3025 | 3007 |
| | 40 | 3125 | 3101 | 3037 | 3013 | 3048 | 3049 | 3064 |
| | 60 | 3125 | 3040 | 2953 | 2933 | 2999 | 3069 | 3142 |
| | 80 | 3075 | 2974 | 2900 | 2884 | 2953 | 3049 | 3141 |
| | 100 | 3033 | 2939 | 2886 | 2870 | 2922 | 3003 | 3077 |
| | 120 | 3038 | 2951 | 2911 | 2882 | 2910 | 2974 | 3033 |
| | 140 | 3098 | 3010 | 2966 | 2916 | 2925 | 2987 | 3047 |
| | 160 | 3123 | 3049 | 3049 | 2967 | 2965 | 3048 | 3052 |
| | 180 | 3027 | 3027 | 2888 | 3027 | 3027 | 3135 | 3027 |

FIG.6

| ELECTRO-MECHANICAL COUPLING FACTOR (%) | | $\psi$ (°) | | | | | | |
|---|---|---|---|---|---|---|---|---|
| | | -60 | -40 | -20 | 0 | 20 | 40 | 60 |
| $\theta$ (°) | 0 | 0.10 | - | 0.10 | 0.10 | - | 0.10 | 0.10 |
| | 20 | 0.21 | 0.34 | - | - | 0.45 | 0.21 | 0.07 |
| | 40 | 0.22 | 0.39 | 0.41 | 0.47 | 0.58 | 0.27 | 0.05 |
| | 60 | 0.13 | 0.30 | 0.46 | 0.59 | 0.58 | 0.27 | 0.04 |
| | 80 | 0.06 | 0.22 | 0.48 | 0.62 | 0.53 | 0.24 | 0.06 |
| | 100 | 0.04 | 0.22 | 0.49 | 0.56 | 0.46 | 0.27 | 0.08 |
| | 120 | 0.05 | 0.26 | 0.50 | 0.44 | 0.35 | 0.33 | 0.13 |
| | 140 | 0.08 | 0.29 | 0.51 | 0.29 | 0.24 | 0.40 | 0.19 |
| | 160 | 0.15 | 0.03 | 0.46 | 0.18 | 0.15 | 0.41 | 0.02 |
| | 180 | 0.10 | 0.10 | 0.39 | 0.10 | 0.10 | - | 0.10 |

FIG.8

| SAW Velocity (m/s) | | $\psi$ (°) | | | | | | |
|---|---|---|---|---|---|---|---|---|
| | | -60 | -40 | -20 | 0 | 20 | 40 | 60 |
| $\theta$ (°) | 0 | 3084 | 3084 | 3003 | 3084 | 3084 | 3003 | 3084 |
| | 20 | 3120 | 3156 | - | 3108 | 3041 | 2986 | 3026 |
| | 40 | 3138 | 3092 | 3009 | 3019 | 3010 | 3009 | 3045 |
| | 60 | 3101 | 3007 | 2931 | 2944 | 2990 | 3053 | 3115 |
| | 80 | 3050 | 2944 | 2885 | 2898 | 2973 | 3071 | 3161 |
| | 100 | 3028 | 2925 | 2881 | 2887 | 2949 | 3041 | 3113 |
| | 120 | 3055 | 2957 | 2919 | 2907 | 2931 | 2997 | 3049 |
| | 140 | 3121 | 3031 | 2992 | 2950 | 2933 | 2979 | 3036 |
| | 160 | 3167 | - | 3087 | 3012 | 2960 | 3007 | 3071 |
| | 180 | 3084 | 3003 | 3084 | 3084 | 3003 | 3084 | 3084 |

FIG.9

| ELECTRO-MECHANICAL COUPLING FACTOR (%) | | $\psi$ (°) | | | | | | |
|---|---|---|---|---|---|---|---|---|
| | | -60 | -40 | -20 | 0 | 20 | 40 | 60 |
| $\theta$ (°) | 0 | 0.25 | 0.25 | 0.01 | 0.25 | 0.25 | 0.01 | 0.25 |
| | 20 | 0.30 | 0.21 | - | 0.51 | 0.37 | 0.08 | 0.22 |
| | 40 | 0.22 | 0.31 | 0.29 | 0.65 | 0.46 | 0.15 | 0.16 |
| | 60 | 0.11 | 0.24 | 0.42 | 0.67 | 0.51 | 0.18 | 0.08 |
| | 80 | 0.04 | 0.19 | 0.46 | 0.65 | 0.50 | 0.19 | 0.02 |
| | 100 | 0.02 | 0.18 | 0.48 | 0.61 | 0.44 | 0.22 | 0.08 |
| | 120 | 0.05 | 0.19 | 0.52 | 0.53 | 0.33 | 0.25 | 0.18 |
| | 140 | 0.10 | 0.19 | 0.56 | 0.44 | 0.21 | 0.26 | 0.29 |
| | 160 | 0.06 | - | 0.45 | 0.35 | 0.09 | 0.27 | 0.15 |
| | 180 | 0.25 | 0.01 | 0.25 | 0.25 | 0.01 | 0.25 | 0.25 |

THIRD AREA (SAW VELOCITY) [m/s]

THIRD AREA (ELECTROMECHANICAL COUPLING FACTOR) [%]

FIG.11

| SAW Velocity (m/s) | | ψ (°) | | | | | | |
|---|---|---|---|---|---|---|---|---|
| | | -60 | -40 | -20 | 0 | 20 | 40 | 60 |
| θ (°) | 0 | 2888 | 3027 | 3027 | 3135 | 3027 | 3027 | - |
| | 20 | 3157 | - | - | 3066 | 2989 | 2981 | 3061 |
| | 40 | 3135 | 3064 | 3001 | 2992 | 2965 | 2984 | 3037 |
| | 60 | 3077 | 2977 | 2923 | 2933 | 2962 | 3025 | 3079 |
| | 80 | 3034 | 2927 | 2880 | 2900 | 2970 | 3068 | 3148 |
| | 100 | 3034 | 2927 | 2880 | 2900 | 2970 | 3068 | 3148 |
| | 120 | 3077 | 2977 | 2923 | 2933 | 2962 | 3025 | 3079 |
| | 140 | 3135 | 3064 | 3001 | 2992 | 2965 | 2984 | 3037 |
| | 160 | 3157 | 3104 | - | 3066 | 2989 | 2981 | 3061 |
| | 180 | - | 3027 | 3027 | 2888 | 3027 | 3027 | 3135 |

FIG.12

| ELECTRO-MECHANICAL COUPLING FACTOR (%) | | ψ (°) | | | | | | |
|---|---|---|---|---|---|---|---|---|
| | | -60 | -40 | -20 | 0 | 20 | 40 | 60 |
| θ (°) | 0 | - | 0.10 | 0.10 | - | 0.10 | 0.10 | - |
| | 20 | 0.17 | - | - | 0.48 | 0.20 | 0.11 | 0.36 |
| | 40 | 0.15 | 0.22 | 0.41 | 0.60 | 0.30 | 0.15 | 0.29 |
| | 60 | 0.08 | 0.19 | 0.46 | 0.63 | 0.39 | 0.17 | 0.17 |
| | 80 | 0.03 | 0.17 | 0.47 | 0.65 | 0.46 | 0.17 | 0.04 |
| | 100 | 0.03 | 0.17 | 0.47 | 0.65 | 0.46 | 0.17 | 0.04 |
| | 120 | 0.08 | 0.19 | 0.46 | 0.63 | 0.39 | 0.17 | 0.17 |
| | 140 | 0.15 | 0.22 | 0.41 | 0.60 | 0.30 | 0.15 | 0.29 |
| | 160 | 0.17 | 0.09 | - | 0.48 | 0.20 | 0.11 | 0.36 |
| | 180 | - | 0.10 | 0.10 | - | 0.10 | 0.10 | - |

FOURTH AREA (SAW VELOCITY) [m/s]

FOURTH AREA (ELECTROMECHANICAL COUPLING FACTOR) [%]

SURFACE ACOUSTIC WAVE DEVICE AND PIEZOELECTRIC SUBSTRATE USED THEREFOR

BACKGROUND OF THE INVENTION

The present invention relates to a surface acoustic wave device and a piezoelectric substrate used therefor.

DESCRIPTION OF THE PRIOR ART

In recent years, various kinds of mobile communication terminal devices, including cellular telephones, have come into widespread use. It is highly desirable to reduce this kind of terminal equipment in size and weight for enhanced portability. In order to reduce the size and weight of terminal devices, their electronic parts must be substantially reduced in size and weight. For this reason, surface acoustic wave devices enabling size and weight reduction, namely, surface acoustic wave filters, are often used for high- and intermediate-frequency parts of terminal devices. Such devices are formed with an inter-digital electrode for exciting, receiving, reflecting and propagating surface acoustic waves on the surface of a piezoelectric substrate thereof.

Among characteristics important to a piezoelectric substrate used for surface acoustic wave devices are surface wave velocity (SAW velocity), temperature coefficient of center frequency in the case of filters or of resonant frequency in the case of resonators (the temperature coefficient of frequency: TCF), and electromechanical coupling factor ($k^2$). The characteristics of typical piezoelectric substrates currently known for surface acoustic wave devices are set forth below in Table 1. For details regarding these characteristics, reference should be made to Yasutaka SHIMIZU, "Propagation characteristics of SAW materials and their current application", the Transactions of The Institute of Electronics, Information and Communication Engineers A, Vol. J76-A, No.2, pp. 129–137 (1993). Hereinafter, the piezoelectric substrates for surface acoustic wave devices are referred to using the designations in Table 1.

TABLE 1

| Symbol | Composition | Cut Angle | Propagation Direction | SAW Velocity (m/s) | $K^2$ (%) |
|---|---|---|---|---|---|
| 128LN | LiNbO$_3$ | 128°-Rotated Y | X | 3992 | 5.5 |
| 64LN | LiNbO$_3$ | 64°-Rotated Y | X | 4742 | 11.3 |
| 36LT | LiTaO$_3$ | 36°-Rotated Y | X | 4212 | 4.7 |
| LT112 | LiTaO$_3$ | X | 112°-Rotated Y | 3288 | 0.64 |
| ST Quartz Crystal | Quartz Crystal | ST | X | 3158 | 0.14 |

As can be seen from Table 1, currently known piezoelectric substrates are divided into the group including 128LN, 64LN, and 36LT which have high SAW velocities and high electromechanical coupling factor and the group including LT112 and ST quartz crystal which have low SAW velocities and low electromechanical coupling factor. The piezoelectric substrates which belong to the group with high SAW velocity and high electromechanical coupling factor (128LN, 64LN, and 36LT) are used for surface acoustic wave filters of high-frequency parts of terminal devices. The piezoelectric substrates which belong to the group with low SAW velocity and low electromechanical coupling factor (LT112 and ST quartz crystal) are used for surface acoustic wave filters of intermediate-frequency parts of terminal devices.

Various systems are practically employed all over the world for mobile communications devices, typically cellular telephones, and are all used at frequencies of the order of 1 GHz. Therefore, filters used for high-frequency parts of terminal devices have a center frequency of approximately 1 GHz. A surface acoustic wave filter has a center frequency substantially proportional to the SAW velocity of the piezoelectric substrate used and almost inversely proportional to the width of electrode fingers formed on the substrate. To enable such filters to be operated at high frequencies, therefore, it is preferable to utilize substrates having high SAW velocities, for instance, 128LN, 64LN, and 36LT. Also, a wide passband width of 20 MHz or more is required for filters used as high-frequency parts. To achieve such wide passband, however, it is essential for the piezoelectric substrate to have a large electromechanical coupling factor $k^2$. For these reasons, much use is made of 128LN, 64LN, and 36LT.

On the other hand, mobile communication terminal devices use an intermediate frequency in the 70 to 300 MHz band. When a filter having a center frequency in this frequency band is constructed using a surface acoustic wave device, if the aforementioned 128LN, 64LN, or 36 LT is used as the piezoelectric substrate, the widths of the electrode fingers formed on the substrate have to be much larger than those of the aforementioned filter used as a high-frequency part.

More specifically, the following equation (1) roughly applies to the relationship among the width d of an electrode finger of a surface acoustic wave transducer that forms a surface acoustic wave filter, the center frequency $f_0$ of the surface acoustic wave filter, and the SAW velocity V of the piezoelectric substrate used.

$$f_0 = V/(4d) \qquad (1)$$

If a surface acoustic wave filter having a center frequency of 1 GHz is constructed on the assumption that the SAW velocity is 4000 m/s, the width of the electrode finger thereof is calculated from the equation (1) to be $$d = 4000 \ (m/s)/(4 \times 1000 \ (MHz)) = 1 \ \mu m$$

On the other hand, when an intermediate-frequency filter having a center frequency of 100 MHz is constructed using this piezoelectric substrate having a SAW velocity of 4000 m/s, the width of the electrode finger required for this is given by $$d = 4000 \ (m/s)/(4 \times 100 \ (MHz)) = 10 \ \mu m$$

Thus, the required width of the electrode finger is ten times as large as that for the high-frequency part filter. A large width of the electrode finger means that the surface acoustic wave intermediate-frequency filter itself becomes large. Therefore, in order to make a surface acoustic wave intermediate-frequency filter small, it is necessary to use a piezoelectric substrate having a low SAW velocity V, as can be appreciated from the equation (1).

For this reason, LT112 and ST quartz crystal, whose SAW velocities are low, are used for the piezoelectric substrates of surface acoustic wave intermediate-frequency filters. ST quartz crystal is particularly suitable because the primary temperature coefficient of frequency TCF is zero. Because the electromechanical coupling factor $k^2$ of ST quartz crystal is low, only a filter having a narrow passband is achievable. However, because it is a function of the intermediate-frequency filters to pass signals through a single narrow channel, the fact that the ST quartz crystal has a small electromechanical coupling factor has caused no problem.

In recent years, however, digital mobile communication systems have been developed and put into practical use. These systems have won very rapid acceptance because of their ability to make effective use of frequency resources, compatibility with digital data communications, and so on. The passband of the digital system is very wide, for instance, several hundred KHz to several MHz. In the case where an intermediate-frequency filter having such a wide passband is constructed using a surface acoustic wave device, it is difficult to use an ST quartz crystal substrate. In order to further reduce the size of mobile communication terminals for enhanced portability, it is required to reduce the mounting area of surface acoustic wave intermediate-frequency filters. However, because the SAW velocities of ST quartz crystal and LT112, which are considered to be suitable for surface acoustic wave intermediate-frequency filters, are over 3100 m/sec, further minimization is difficult.

As explained above, when surface acoustic wave devices for intermediate-frequency are constructed using piezoelectric substrates having high electromechanical coupling factor such as 128LN, 64LN, and 36LT, the device size must be large since the SAW velocities of the substrates are high, although a wide passband can be obtained. On the other hand, when surface acoustic wave devices for intermediate-frequency are constructed using piezoelectric substrates having low SAW velocities such as ST quartz crystal and LT112 in order to reduce the device size, a wide passband cannot be obtained since the electromechanical coupling factors of the substrates are low. Thus, surface acoustic wave devices for intermediate-frequency having excellent characteristics cannot be obtained in either case.

SUMMARY OF THE INVENTION

It is therefore an object of the present invention to provide a surface acoustic wave device for intermediate-frequency enabling miniaturization and band-widening.

Another object of the present invention is to provide a piezoelectric substrate for use in a surface acoustic wave device having high electromechanical coupling factor and low SAW velocity.

The above and other objects of the present invention can be accomplished by a surface acoustic wave device comprising a piezoelectric substrate and inter-digital electrodes formed on the piezoelectric substrate, wherein: the piezoelectric substrate has a crystal structure of $Ca_3Ga_2Ge_4O_{14}$ type and is represented by the chemical formula, $Sr_3NbGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in one of a first area represented by $-5° \leq \phi \leq 15°$, $0° \leq \theta \leq 180°$, and $-50° \leq \psi \leq 50°$ and a second area represented by $15° \leq \phi \leq 30°$, $0° \leq \theta \leq 180°$, and $-40° \leq \psi \leq 40°$.

The above and other objects of the present invention can be also accomplished by a piezoelectric substrate for use in a surface acoustic wave device, characterized in that the piezoelectric substrate has a crystal structure of $Ca_3Ga_2Ge_4O_{14}$ type and is represented by the chemical formula, $Sr_3NbGa_3Si_2O_{14}$; a cut angle of the piezoelectric substrate cut out of the single crystal and a direction of propagation of surface acoustic waves on the piezoelectric substrate represented in terms of Euler's angles ($\phi$, $\theta$, $\psi$) are found in one of a first area represented by $-5° \leq \phi \leq 15°$, $0° \leq \theta \leq 180°$, and $-50° \leq \psi \leq 50°$ and a second area represented by $15° \leq \phi \leq 30°$, $0° \leq \theta \leq 180°$, and $-40° \leq \psi \leq 40°$.

The present invention is based on the experimentally acquired knowledge that when a single crystal represented by the chemical formula, $Sr_3NbGa_3Si_2O_{14}$ (hereinafter, a single crystal including Sr, Nb, Ga, and Si is referred to as "an SNGS single crystal") has a specifically combined cut angle and direction of propagation of surface acoustic waves such that when represented by $\phi$, $\theta$, and $\psi$ in terms of Euler's angles ($\phi$, $\theta$, $\psi$), they are present within the first area or the second area, such properties as expressed in terms of a SAW velocity of less than 3100 m/s and an electromechanical coupling factor of greater than 0.2% can be obtained.

The present invention is intended to achieve a surface acoustic wave device having excellent characteristics by employing an SNGS single crystal as the substrate of the surface acoustic wave device and selecting the cut angle of the crystal and the direction of propagation of surface acoustic waves within a specific range.

In the present invention, the SNGS crystal is most preferably $Sr_3NbGa_3Si_2O_{14}$. However, the composition ratios between the respective elements may be slightly varied insofar as the technical advantages of the present invention are not diminished. Further, the SNGS single crystal may contain unavoidable impurities such as Al, Zr, Fe, Ce, Nd, Pt and Ca. Furthermore, the SNGS single crystal may contain oxygen defects. The method of manufacturing the SNGS single crystal is not particularly limited. An ordinary crystal growing process such as the CZ process can be employed for manufacturing the SNGS single crystal.

It is to be noted that the SNGS single crystal is a trigonal system, and so mutually equivalent combinations of Euler's angles exist due to crystal symmetry. In the trigonal system substrate, $\phi=120°$ to $240°$ and $\phi=240°$ to $360°$ ($-120°$ to $0°$) are equivalent to $\phi=0°$ to $120°$; $\theta=360°$ to $180°$ ($0°$ to $-180°$) is equivalent to $\theta=0°$ to $180°$; and $\psi=270°$ to $90°$ is equivalent to $\psi=-90°$ to $90°$. For example, $\phi=130°$ and $\phi=250°$ are equivalent to $\phi=10°$; $\theta=330°$ is equivalent to $\theta=30°$; and $\psi=240°$ is equivalent to $\psi=60°$.

Further, in the trigonal system substrate, the characteristics thereof at all cut angles and in all propagation directions can be learned by determining the characteristics in the range of $\phi$ from $0°$ to $30°$.

Therefore, in order to learn the characteristics thereof at all cut angles and in all propagation directions, it is sufficient to study the characteristics thereof only in the range of $\phi_0=0°$ to $30°$s, $\theta_0=0°$ to $180°$ and $\psi_0=-90°$ to $90°$. Based on the combination ($\phi_0$, $\theta_0$, $\psi_0$), an equivalent combination exhibiting the same characteristics in the range of $\phi=30°$ to $120°$ can be learned. Concretely, in the range of $30° \leq \phi \leq 60°$, ($\phi$, $\theta$, $\psi$) equivalent to ($\phi_0$, $\theta_0$, $\psi_0$) can be obtained by $\phi=60°-\phi_0$, $\theta=180°-\theta_0$ and $\psi=\psi_0$; in the range of $60° \leq \phi \leq 90°$, ($\phi$, $\theta$, $\psi$) equivalent to ($\phi_0$, $\theta_0$, $\psi_0$) can be obtained by $\phi=60°+\phi_0$, $\theta=180°-\theta_0$ and $\psi=\psi_0$; and in the range of $90° \leq \phi \leq 120°$, ($\phi$, $\theta$, $\psi$) equivalent to ($\phi_0$, $\theta_0$, $\psi_0$) can be obtained by $\phi=120°-\phi_0$, $\theta=\theta_0$ and $\psi=-\psi_0$. As a result, based on the aforementioned symmetrical property, the characteristics of the SNGS single crystal substrate for all ($\phi$, $\theta$, $\psi$) can be learned.

Set out below are exemplary equivalent combinations.

Equivalent to ($0°$, $140°$, $25°$) are ($60°$, $40°$, $25°$), ($60°$, $40°$, $-25°$) and ($120°$, $140°$, $-25°$) and since $\phi=120°$ is equivalent to $\phi=0°$, ($0°$, $140°$, $-25°$) is also equivalent to ($0°$, $140°$, $25°$).

The first area and the second area include all combinations of equivalent (φ, θ, ψ) obtained in the above described manner.

In general, the surface acoustic wave device according to the present invention lends itself well to filters used in the frequency band of 10 to 500 MHz particularly, 10 to 300 MHz.

Further, the surface acoustic wave device according to the present invention is also useful for making a surface acoustic wave delay element small, because of the low SAW velocity thereof.

In a preferred aspect of the present invention, θ in the first area ranges from 20° to 120° and ψ in the first area ranges from −40° to 40°.

In another preferred aspect of the present invention, φ in the first area ranges from −5° to 5°, θ in the first area ranges from 120° to 160°, and ψ in the first area ranges either from 20° to 40° or from −20° to −40°.

In still another preferred aspect of the present invention, φ in the first area ranges from 5° to 15°, θ in the first area ranges from 120° to 180°, and ψ in the first area ranges from 0° to −40°.

In still another preferred aspect of the present invention, θ in the second area ranges from 20° to 160° and ψ in the second area ranges from −20° to −40°.

According to the preferred aspects of the present invention, a SAW velocity of less than 3100 m/s and an electromechanical coupling factor of greater than 0.4% can be obtained, so that a wider passband can be obtained.

BRIEF DESCRIPTION OF THE DRAWINGS

FIG. 2 is a table showing the SAW velocities of surface acoustic wave devices when φ, θ, and ψ of the piezoelectric substrates were 0°, a certain value between 0° and 180°, and a certain value between 0° to 60°, respectively.

FIG. 3 is a table showing the electromechanical coupling factors of surface acoustic wave devices when φ, θ, and ψ of the piezoelectric substrates were 0°, a certain value between 0° and 180°, and a certain value between 0° to 60°, respectively.

FIG. 5 is a table showing the SAW velocities of surface acoustic wave devices when φ, θ, and ψ of the piezoelectric substrates were 10°, a certain value between 0° and 180°, and a certain value between −60° to 60°, respectively.

FIG. 6 is a table showing the electromechanical coupling factors of surface acoustic wave devices when φ, θ, and ψ of the piezoelectric substrates were 10°, a certain value between 0° and 180°, and a certain value between −60° to 60°, respectively.

FIG. 8 is a table showing the SAW velocities of surface acoustic wave devices when φ, θ, and ψ of the piezoelectric substrates were 20°, a certain value between 0° and 180°, and a certain value between −60° to 60°, respectively.

FIG. 9 is a table showing the electromechanical coupling factors of surface acoustic wave devices when φ, θ, and ψ of the piezoelectric substrates were 20°, a certain value between 0° and 180°, and a certain value between −60° to 60°, respectively.

FIG. 11 is a table showing the SAW velocities of surface acoustic wave devices when φ, θ, and ψ of the piezoelectric substrates were 30°, a certain value between 0° and 180°, and a certain value between −60° to 60°, respectively.

FIG. 12 is a table showing the electromechanical coupling factors of surface acoustic wave devices when φ, θ, and ψ of the piezoelectric substrates were 30°, a certain value between 0° and 180°, and a certain value between −60° to 60°, respectively.

DESCRIPTION OF THE PREFERRED EMBODIMENTS

Preferred embodiments of the present invention will now be explained with reference to the drawings.

Figure 1:
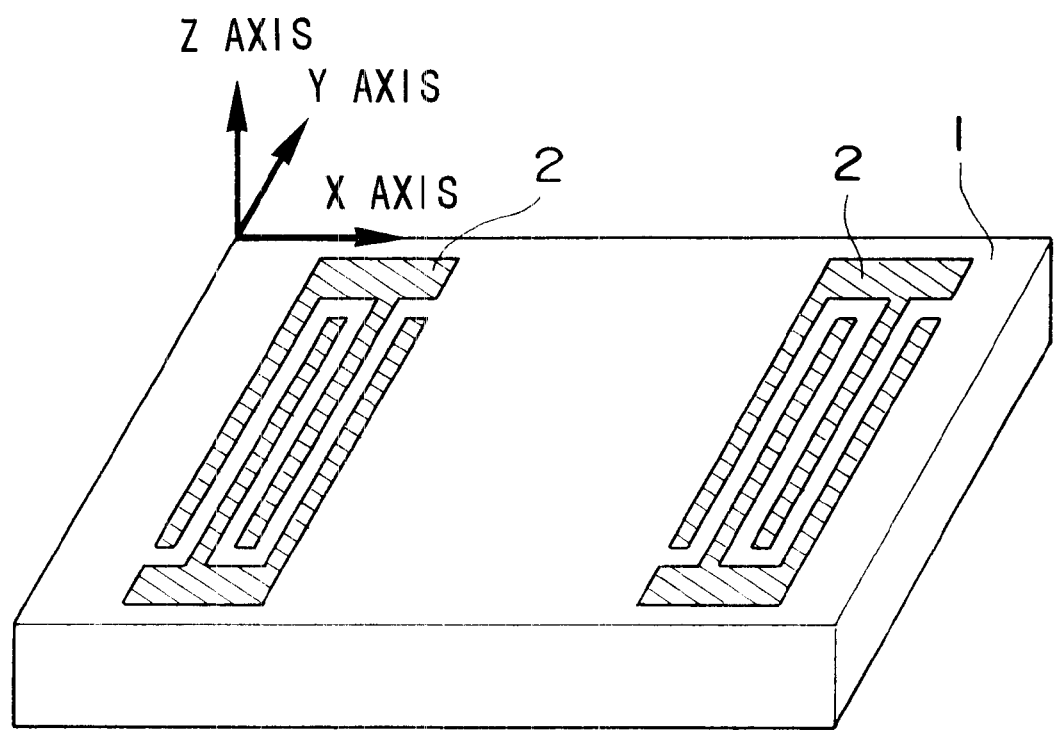
FIG. 1 is schematic perspective view showing a surface acoustic wave device which is a preferred embodiment of the present invention.

FIG. 1 is schematic perspective view showing a surface acoustic wave device which is a preferred embodiment of the present invention.

As shown in FIG. 1, a surface acoustic wave device which is a preferred embodiment of the present invention includes a pair of inter-digital electrodes 2, 2 on the surface of a piezoelectric substrate 1. An SNGS single crystal is used as the piezoelectric substrate 1 and the SNGS single crystal has a crystal form belonging to the point group 32. The x, y and z axes shown in FIG. 1 are perpendicular to each other. The z axis and y axis lie in a plane including the surface of the piezoelectric substrate 1 and the z axis defines the direction of propagation of surface acoustic waves.

The size of the piezoelectric substrate 1 is not limited but may generally be of the order of 4 to 10 mm in the direction of propagation of surface acoustic waves and of the order of 2 to 4 mm in the direction perpendicular thereto. The thickness of the piezoelectric substrate 1 may be of the order of 0.2 to 0.4 mm.

The inter-digital electrodes 2, 2 formed on the piezoelectric substrate 1 are thin layer electrodes for exciting, receiving, reflecting and propagating surface acoustic waves and are formed in a periodical stripe-like manner. The inter-digital electrodes 2, 2 are patterned so that the direction of propagation of surface acoustic waves coincides with the direction of the x axis. The inter-digital electrodes 2, 2 may be formed as by vacuum evaporation or sputtering, using Al or an Al alloy such as Al—Cu. The finger width of the inter-digital electrodes 2, 2 may be appropriately determined depending on the frequency to which the surface acoustic wave device is applied and may generally be of the order of 2 to 10 μm at the frequency band to which the present invention is applied.

The z axis perpendicular to the surface of the piezoelectric substrate 1 defines the cut angle (cut plane) of the piezoelectric substrate cut out of a single crystal. Relationships between the x axis, y axis and z axis and the X axis, Y axis and Z axis of the SNGS single crystal may be represented in terms of Euler's angles (φ, θ, ψ).

When the cut angle of the piezoelectric substrate 1 and the direction of propagation are represented in terms of Euler's angles ($\phi$, $\theta$, $\psi$) in the surface acoustic wave device according to the present invention, $\phi$, $\theta$, and $\psi$ are present in each of following first to fourth areas.

First area is defined as follows:

$\phi = -5° \sim 5°$ $\theta = 0° \sim 180°$ $\psi = -50° \sim 50°$

The preferable range of the first area is defined as follows:

$\phi = -5° \sim 5°$ $\theta = 20° \sim 120°$ $\psi = -40° \sim 40°$

Another preferable range of the first area is defined as follows:

$\phi = -5 \sim 5°$ $\theta = 120° \sim 160°$ $\psi = 20° \sim 40°$

Further preferable range of the first area is defined as follows:

$\phi = -5° \sim 5°$ $\theta = 120° \sim 160°$ $\psi = -40° \sim -20°$

In the first area, there is a combination of $\phi$, $\theta$ and $\psi$ whereat the SAW velocity of the piezoelectric substrate 1 is at most 3100 m/s, which is markedly lower than that of ST quartz crystal, and the electromechanical coupling factor of the piezoelectric substrate 1 is large and at least 0.2%. Particularly, in each of the preferable ranges of the first area, there is a combination of $\phi$, $\theta$ and $\psi$ whereat the electromechanical coupling factor of the piezoelectric substrate 1 is at least 0.4%, which is markedly larger than that of ST quartz crystal.

Second area is defined as follows:

$\phi = 5° \sim 15°$ (excluding 5°)

$\theta = 0° \sim 180°$ $\psi = -50° \sim 50°$

The preferable range of the second area is defined as follows:

$\phi = 5° \sim 15°$ (excluding 5°)

$\theta = 20° \sim 120°$ $\psi = -40° \sim 40°$

Another preferable range of the second area is defined as follows:

$\phi = 5° \sim 15°$ (excluding 5°)

$\theta = 120° \sim 180°$ $\psi = 0° \sim 40°$

In the second area, there is a combination of $\phi$, $\theta$ and $\psi$ whereat the SAW velocity of the piezoelectric substrate 1 is at most 3100 m/s, which is markedly lower than that of ST quartz crystal, and the electromechanical coupling factor of the piezoelectric substrate 1 is large and at least 0.2%. Particularly, in each of the preferable ranges of the second area, there is a combination of $\phi$, $\theta$ and $\psi$ whereat the electromechanical coupling factor of the piezoelectric substrate 1 is at least 0.4%, which is markedly larger than that of ST quartz crystal.

Third area is defined as follows:

$\phi = 15° \sim 25°$ (excluding 15°)

$\theta = 0° \sim 180°$ $\psi = -40° \sim 40°$

The preferable range of the third area is defined as follows:

$\phi = 15° \sim 25°$ (excluding 15°)

$\theta = 20° \sim 160°$ $\psi = -20° \sim 20°$

In the third area, there is a combination of $\phi$, $\theta$ and $\psi$ whereat the SAW velocity of the piezoelectric substrate 1 is at most 3100 m/s, which is markedly lower than that of ST quartz crystal, and the electromechanical coupling factor of the piezoelectric substrate 1 is large and at least 0.2%. Particularly, in the preferable range of the third area, there is a combination of $\phi$, $\theta$ and $\psi$ whereat the electromechanical coupling factor of the piezoelectric substrate 1 is at least 0.4%, which is markedly larger than that of ST quartz crystal.

Fourth area is defined as follows:

$\phi = 25° \sim 35°$ (excluding 25°)

$\theta = 0° \sim 180°$ $\psi = -40° \sim 40°$

The preferable range of the fourth area is defined as follows:

$\phi = 25° \sim 35°$ (excluding 25°)

$\theta = 20° \sim 160°$ $\psi = -20° \sim 20°$

In the fourth area, there is a combination of $\phi$, $\theta$ and $\psi$ whereat the SAW velocity of the piezoelectric substrate 1 is at most 3100 m/s, which is markedly lower than that of ST quartz crystal, and the electromechanical coupling factor of the piezoelectric substrate 1 is large and at least 0.2%. Particularly, in the preferable range of the fourth area, there is a combination of φ, θ and ψ whereat the electromechanical coupling factor of the piezoelectric substrate 1 is at least 0.4%, which is markedly larger than that of ST quartz crystal.

Therefore, the surface acoustic wave device using the piezoelectric substrate 1 in which the combination of φ, θ and ψ falls in one of the first to fourth areas has a wide passband because the piezoelectric substrate 1 has a high electromechanical coupling factor and is small in size because the piezoelectric substrate 1 has a low SAW velocity.

EXAMPLE

First, a single crystal (SNGS single crystal) belonging to the point group 32 and represented by the chemical formula, $Sr_3NbGa_3Si_2O_{14}$, was fabricated. The fabrication of the SNGS single crystal was performed by means of the CZ process using a high-frequency heating, i.e., Czochralski growth method. The substrate was cut out from the obtained SNGS single crystal to obtain the piezoelectric substrate used for the surface acoustic wave device.

Next, a pair of inter-digital electrodes 2, 2 was formed on the surface of the piezoelectric substrate cut out from the SNGS single crystal, thereby producing the surface acoustic wave device. The inter-digital electrodes 2, 2 were formed by vacuum evaporation of Al and patterning by photoetching process. An electrode finger pitch which corresponds to surface acoustic wavelength λ was 60 μm. The number of electrode finger pairs was 20. The aperture width of electrode fingers was 60λ (3600 μm). The electrode thickness was 0.3 μm.

A plurality of surface acoustic wave devices of the foregoing structure having different cut angle of the piezoelectric substrate and/or the propagation direction of the surface acoustic waves were fabricated, and their SAW velocities and electromechanical coupling factors were measured. The SAW velocities were obtained by multiplying the measured center frequency of the filter having inter-digital electrodes 2, 2 configured in the foregoing manner by the length of the surface acoustic wave. The electromechanical coupling factors were determined from the conductance and susceptance of the two-terminal measured at one of the inter-digital electrodes 2, 2, the input side for example, using the well-known Smith's equivalent circuit model. This method is explained in detail at "4.1.2 effective electromechanical coupling factor of surface wave" in "Chapter I. Basis" in "Surface Acoustic Wave Device and its Application (edited by Electronic Materials Manufacturers Association, published by The Nikkan Kogyo Shinbun, Ltd 1978)." The measurements were performed with the temperature around the device kept at 25° C. The results of the measurements are shown in FIGS. 2–13.

Figure 4A:
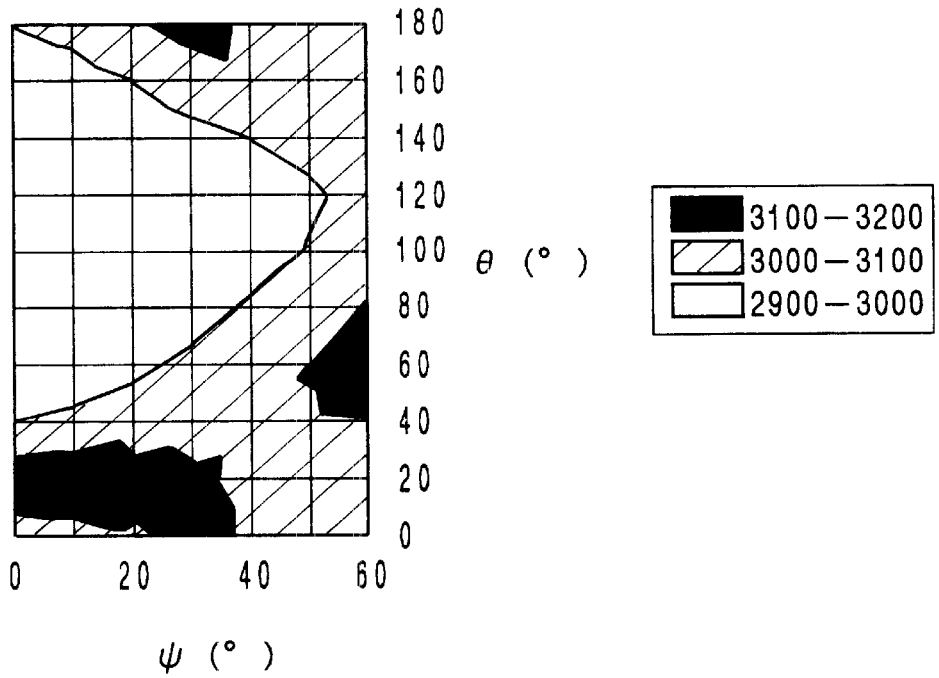
FIG. 4(a) is a contour map showing the SAW velocities indicated in FIG. 2.
Figure 4B:
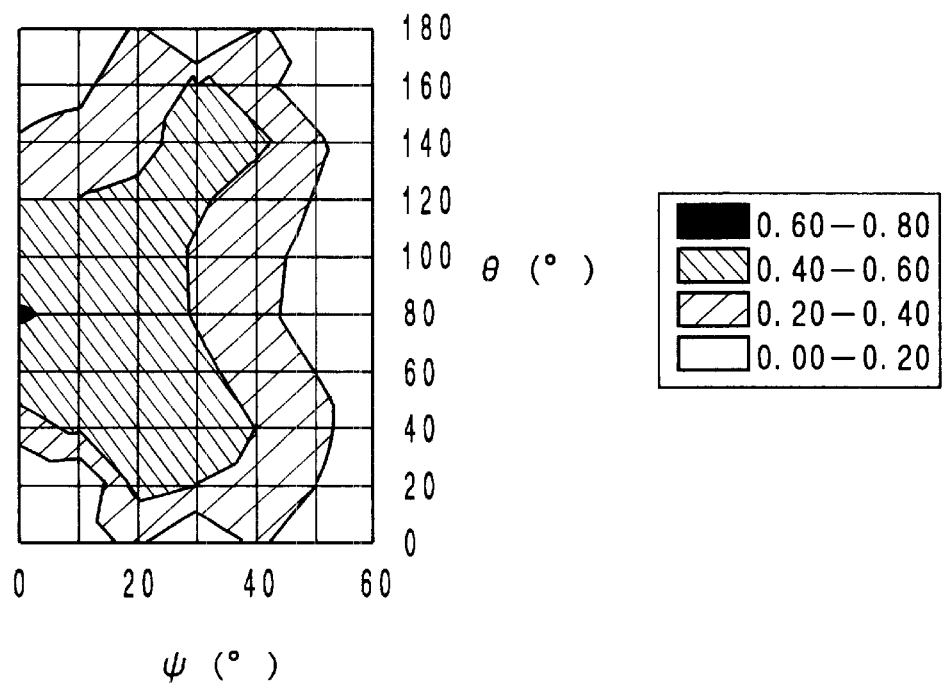
FIG. 4(b) is a contour map showing the electromechanical coupling factors indicated in FIG. 3.

FIG. 2 shows the SAW velocities of the surface acoustic wave devices where φ, θ, and ψ of the piezoelectric substrates were 0°, a certain value between 0° and 180°, and a certain value between 0° to 60°, respectively. FIG. 3 shows the electromechanical coupling factors of the surface acoustic wave devices where φ, θ, and ψ of the piezoelectric substrates were 0°, a certain value between 0° and 180°, and a certain value between 0° to 60°, respectively. FIG. 4(a) two-dimensionally represents the SAW velocities indicated in FIG. 2. FIG. 4(b) two-dimensionally represents the electromechanical coupling factors indicated in FIG. 3. In case of φ being 0°, the SAW velocity and the electromechanical coupling factor of the device when ψ was 0° to −60° took the same value as the device when ψ was 0° to 60° shown in FIGS. 2 and 3, since ψ is symmetrical with respect to 0° due to crystal symmetry.

As shown FIGS. 2–4, in the case where φ was 0°, θ was found in the range of 0° to 180°, and ψ was found in the range of 0° to 50° (0° to −50°), the electromechanical coupling factor became greater than 0.2% and the SAW velocity became less than 3100 m/sec. Particularly, in the case where θ was found in the range of 20° to 120° and ψ was found in the range of 0° to 40° (0° to −40°), the electromechanical coupling factor became greater than 0.4% and the SAW velocity became still lower. Further, in the case where θ was found in the range of 120° to 160° and ψ was found in the range of 20° to 40° (−20° to −40°), the electromechanical coupling factor again became greater than 0.4%. The above-described characteristics can be obtained in the case where φ is 0±5°.

Figure 7A:
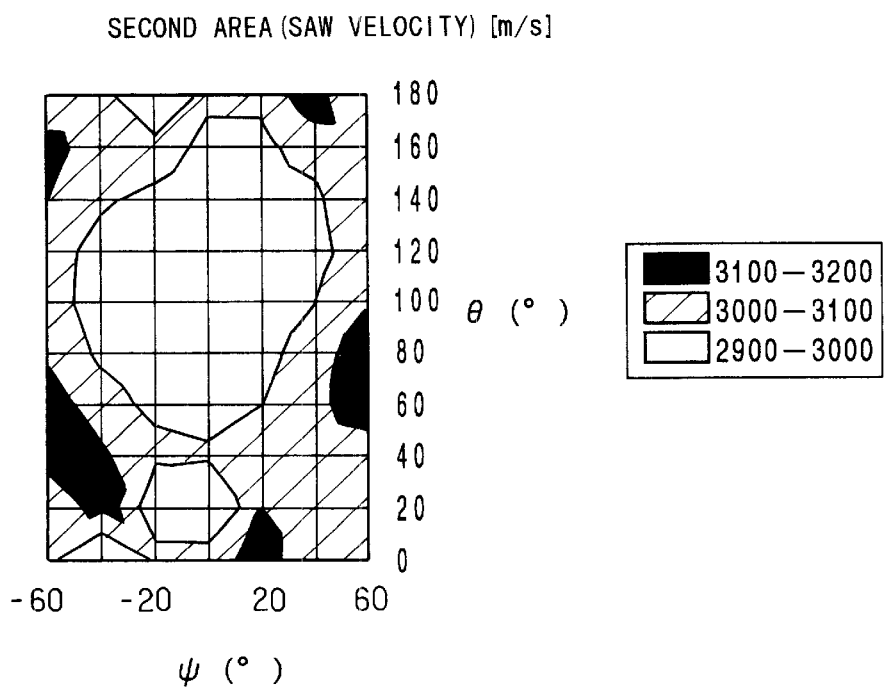
FIG. 7(a) is a contour map showing the SAW velocities indicated in FIG. 5.
Figure 7B:
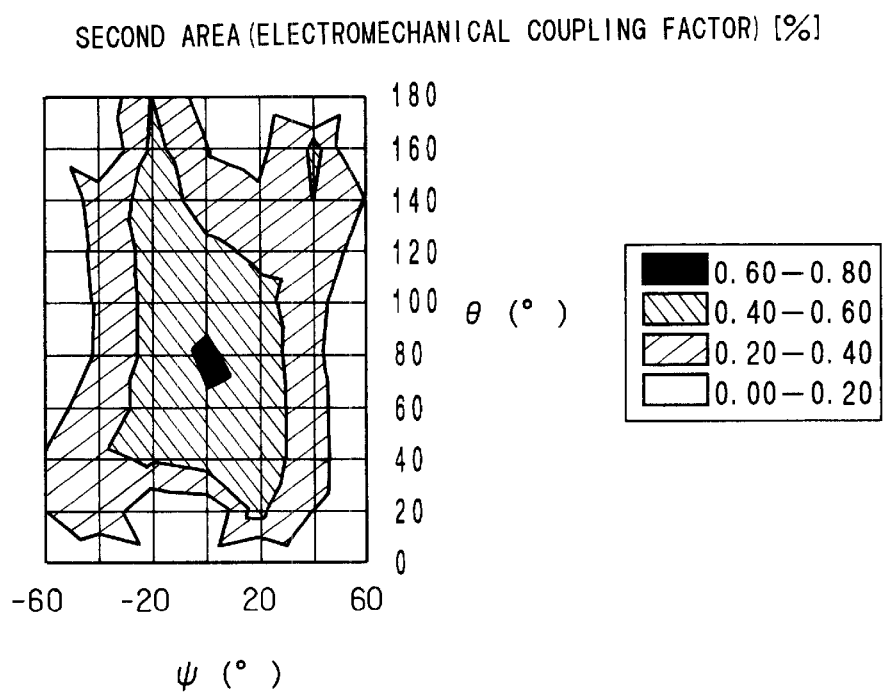
FIG. 7(b) is a contour map showing the electromechanical coupling factors indicated in FIG. 6.

FIG. 5 shows the SAW velocities of the surface acoustic wave devices when φ, θ and ψ of the piezoelectric substrates were 10°, a certain value between 0° and 180°, and a certain value between −60° to 60°, respectively. FIG. 6 shows the electromechanical coupling factors of the surface acoustic wave devices when φ, θ, and ψ of the piezoelectric substrates were 10°, a certain value between 0° and 180°, and a certain value between −60° to 60°, respectively. FIG. 7(a) two-dimensionally represents the SAW velocities indicated in FIG. 5. FIG. 7(b) two-dimensionally represents the electromechanical coupling factors indicated in FIG. 6.

As shown FIGS. 5–7, in the case where φ was 10°, θ was found in the range of 0° to 180°, and ψ was found in the range of −50° to 50°, the electromechanical coupling factor became greater than 0.2% and the SAW velocity became less than 3100 m/sec. Particularly, in the case where θ was found in the range of 20° to 120° and ψ was found in the range of −40° to 40°, the electromechanical coupling factor became greater than 0.4% and the SAW velocity became still lower. Further, in the case where θ was found in the range of 120° to 180° and ψ was found in the range of 0° to −40°, the electromechanical coupling factor again became greater than 0.4%. The above-described characteristics can be obtained in the case where φ is 10±50.

FIG. 8 shows the SAW velocities of the surface acoustic wave devices when φ, θ, and ψ of the piezoelectric substrates were 20°, a certain value between 0° and 180°, and a certain value between −60° to 60°, respectively. FIG. 9 shows the electromechanical coupling factors of the surface acoustic wave devices when φ, θ, and ψ of the piezoelectric substrates were 20°, a certain value between 0° and 180°, and a certain value between −60° to 60°, respectively. FIG. 10(a) two-dimensionally represents the SAW velocities indicated in FIG. 8. FIG. 10(b) two-dimensionally represents the electromechanical coupling factors indicated in FIG. 9.

Figure 10:
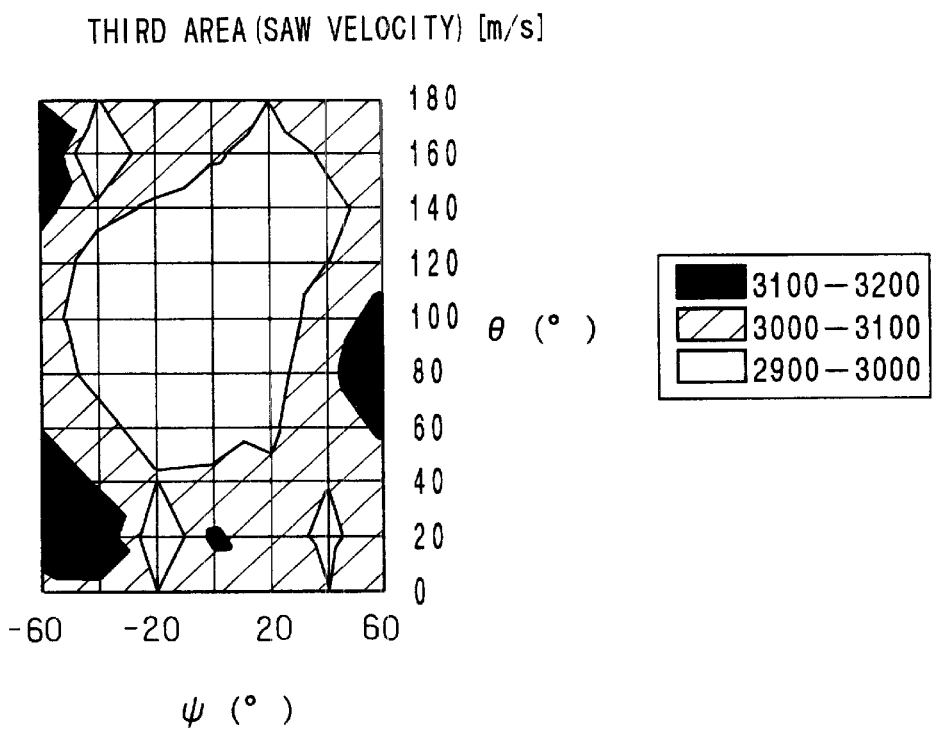
FIG. 10(a) is a contour map showing the SAW velocities indicated in FIG. 8.
FIG. 10(b) is a contour map showing the electromechanical coupling factors indicated in FIG. 9.
Figure 10:
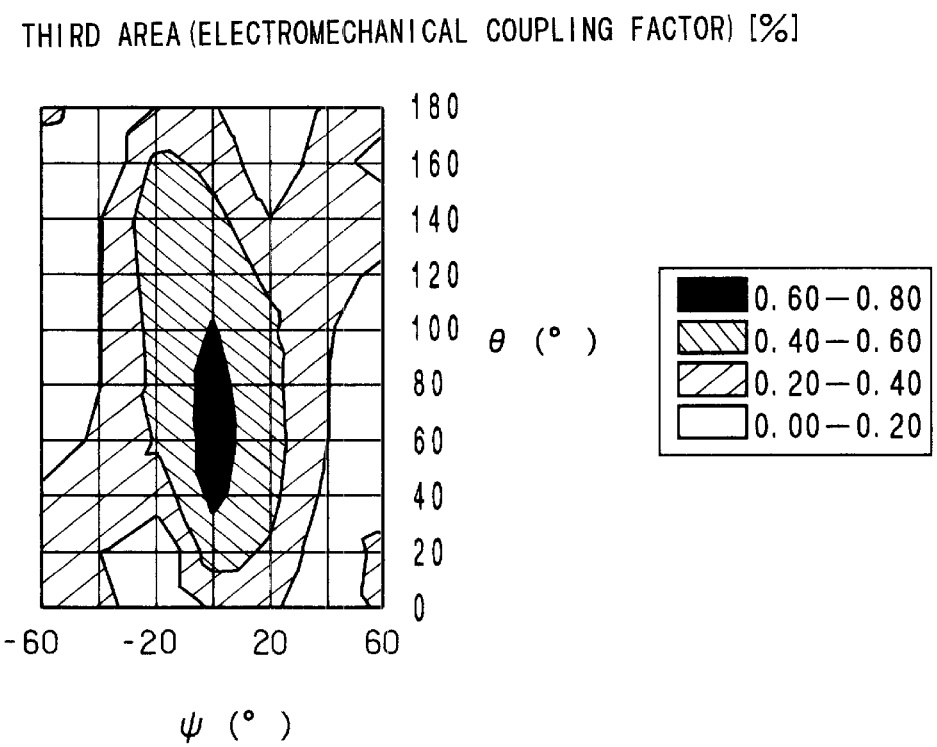

As shown FIGS. 8–10, in the case where φ was 20°, θ was found in the range of 0° to 180°, and ψ was found in the range of −40° to 40°, the electromechanical coupling factor became greater than 0.2% and the SAW velocity became less than 3100 m/sec. Particularly, in the case where θ was found in the range of 20° to 160° and ψ was found in the range of −20° to 20°, the electromechanical coupling factor became greater than 0.4% and the SAW velocity became still lower. The above-described characteristics can be obtained in the case where φ is 20±5°.

Figure 13A:
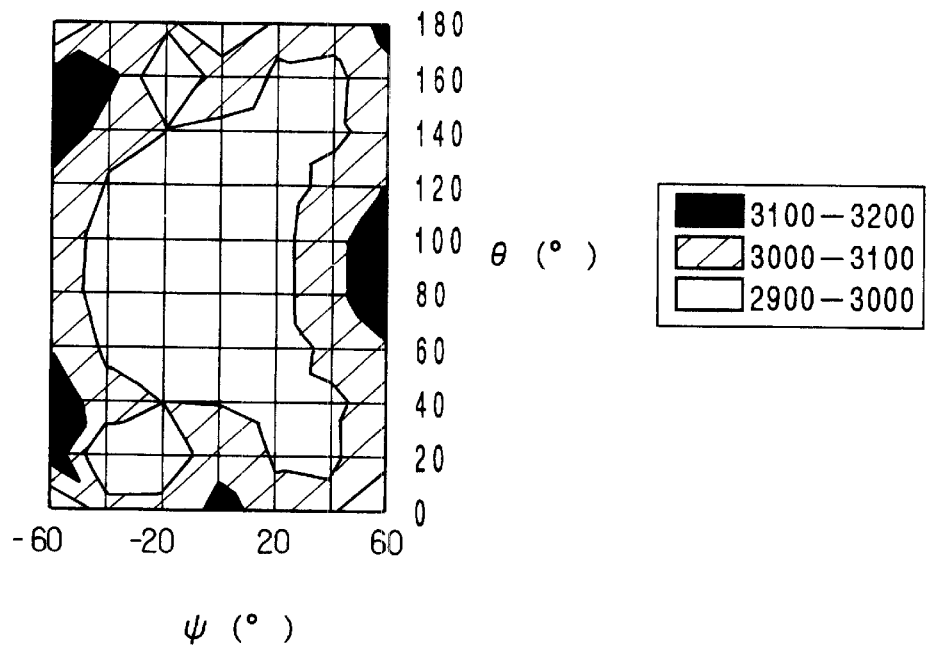
FIG. 13(a) is a contour map showing the SAW velocities indicated in FIG. 11.
Figure 13B:
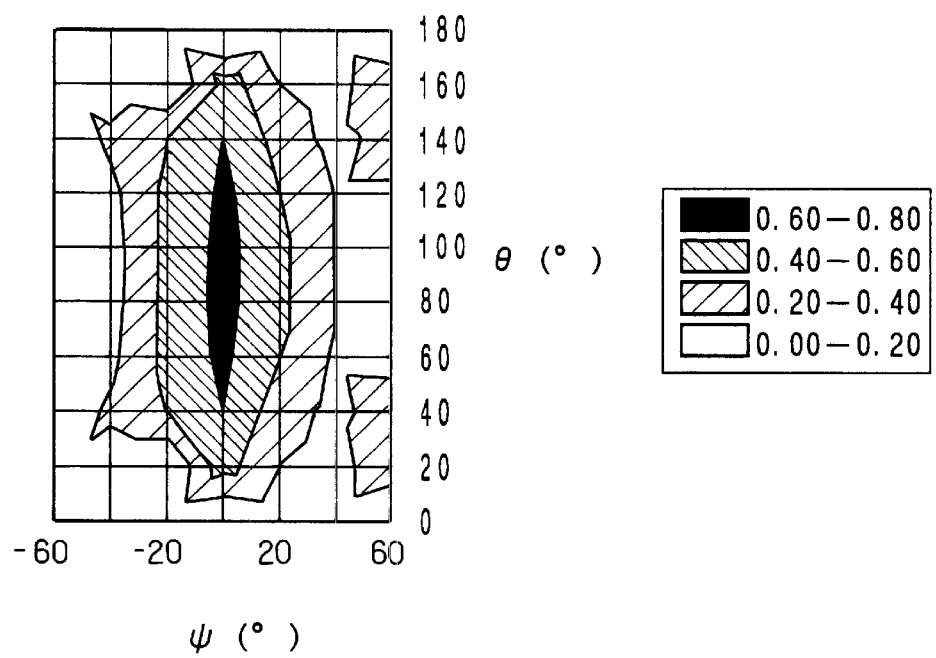
FIG. 13(b) is a contour map showing the electromechanical coupling factors indicated in FIG. 12.

FIG. 11 shows the SAW velocities of the surface acoustic wave devices when φ, θ, and ψ of the piezoelectric substrates were 30°, a certain value between 0° and 180°, and a certain value between −60° to 60°, respectively. FIG. 12 shows the electromechanical coupling factors of the surface acoustic wave devices when φ, θ, and ψ of the piezoelectric substrates were 30°, a certain value between 0° and 180°, and a certain value between −60° to 60°, respectively. FIG. 13(*a*) two-dimensionally represents the SAW velocities indicated in FIG. 11. FIG. 13(*b*) two-dimensionally represents the electromechanical coupling factors indicated in FIG. 12.

As shown FIGS. 11–13, in the case where φ was 30°, θ was found in the range of 0° to 180°, and ψ was found in the range of −40° to 40°, the electromechanical coupling factor became greater than 0.2% and the SAW velocity became less than 3100 m/sec. Particularly, in the case where θ was found in the range of 20° to 160° and ψ was found in the range of −20° to 20°, the electromechanical coupling factor became greater than 0.4% and the SAW velocity became still lower. The above-described characteristics can be obtained in the case where φ is 30±5°.

The present invention has thus been shown and described with reference to specific embodiments. However, it should be noted that the present invention is in no way limited to the details of the described arrangements but changes and modifications may be made without departing from the scope of the appended claims.

As described above, according to the present invention, a compact and wide band surface acoustic wave device for intermediate-frequency can be provided. Further, according to the present invention, a piezoelectric substrate for use in a surface acoustic wave device having high electromechanical coupling factor and low SAW velocity can be also provided.

What is claimed is:

1. A surface acoustic wave device comprising a piezoelectric substrate and inter-digital electrodes formed on the piezoelectric substrate, wherein:

the piezoelectric substrate has a crystal structure of $Ca_3Ga_2Ge_4O_{14}$ type and is represented by the chemical formula, $Sr_3NbGa_3Si_2O_{14}$; and a cut angle of the piezoelectric substrate cut out of the single crystal and a direction of propagation of surface acoustic waves on the piezoelectric substrate represented in terms of Euler's angles (φ, θ, ψ) are found in one of a first area represented by $-5° \leq \phi \leq 15°$, $0° \leq \theta \leq 180°$, and $-50° \leq \psi \leq 50°$ and a second area represented by $15° \leq \phi \leq 30°$, $0° \leq \theta \leq 180°$, and $-40° \leq \psi \leq 40°$.

2. The surface acoustic wave device as claimed in claim 1, wherein θ in the first area ranges from 20° to 120° and ψ in the first area ranges from −40° to 40°.

3. The surface acoustic wave device as claimed in claim 1, wherein φ in the first area ranges from −5° to 5°, θ in the first area ranges from 120° to 160°, and ψ in the first area ranges either from 20° to 40° or from −20° to −40°.

4. The surface acoustic wave device as claimed in claim 1, wherein φ in the first area ranges from 5° to 15°, θ in the first area ranges from 120° to 180°, and ψ in the first area ranges from 0° to −40°.

5. The surface acoustic wave device as claimed in claim 1, wherein θ in the second area ranges from 20° to 160° and ψ in the second area ranges from −20° to −40°.

6. A piezoelectric substrate for use in a surface acoustic wave device, characterized in that:

the piezoelectric substrate has a crystal structure of $Ca_3Ga_2Ge_4O_{14}$ type and is represented by the chemical formula, $Sr_3NbGa_3Si_2O_{14}$; and a cut angle of the piezoelectric substrate cut out of the single crystal and a direction of propagation of surface acoustic waves on the piezoelectric substrate represented in terms of Euler's angles (φ, θ, ψ) are found in one of a first area represented by $-5° \leq \phi \leq 15°$, $0° \leq \theta \leq 180°$, and $-50° \leq \psi \leq 50°$ and a second area represented by $15° \leq \phi \leq 30°$, $0° \leq \theta \leq 180°$, and $-40° \leq \psi \leq 40°$.

7. The piezoelectric substrate as claimed in claim 6, wherein θ in the first area ranges from 20° to 120° and ψ in the first area ranges from −40° to 40°.

8. The piezoelectric substrate as claimed in claim 6, wherein φ in the first area ranges from −5° to 5°, θ in the first area ranges from 120° to 160°, and ψ in the first area ranges either from 20° to 40° or from −20° to −40°.

9. The piezoelectric substrate as claimed in claim 6, wherein φ in the first area ranges from 5° to 15°, θ in the first area ranges from 120° to 180°, and ψ in the first area ranges from 0° to −40°.

10. The piezoelectric substrate as claimed in claim 6, wherein θ in the second area ranges from 20° to 160° and ψ in the second area ranges from −20° to −40°.

* * * * *

UNITED STATES PATENT AND TRADEMARK OFFICE
CERTIFICATE OF CORRECTION

PATENT NO. : 6,452,306 B1
DATED : September 17, 2002
INVENTOR(S) : Kenji Inoue et al.

It is certified that error appears in the above-identified patent and that said Letters Patent is hereby corrected as shown below:

<u>Title page,</u>
Item [56], OTHER PUBLICATIONS, change "Propertties" to -- Properties --.

<u>Column 5,</u>
Line 34, after the word "is" add -- a --.

<u>Column 6,</u>
Line 29, after the word "is" add -- a --.
Lines 39 and 40, change "z" to -- x --.

<u>Column 9,</u>
Line 36, change "angle" to -- angles --.

<u>Column 10,</u>
Lines 31 and 55, after the word "shown" add -- in --.
Line 43, change "10±50" to -- 10± 5° --.

<u>Column 11,</u>
Line 9, after the word "shown" add -- in --.

<u>Column 12,</u>
Line 26, after "-5°", add -- $\phi \leqq$ --.

Signed and Sealed this

Thirtieth Day of September, 2003

JAMES E. ROGAN
*Director of the United States Patent and Trademark Office*